(12) United States Patent
Chan et al.

(10) Patent No.: US 8,391,097 B2
(45) Date of Patent: Mar. 5, 2013

(54) MEMORY WORD-LINE DRIVER HAVING REDUCED POWER CONSUMPTION

(75) Inventors: Wei Min Chan, Sindian (TW); Yen-Huei Chen, Jhudong Township, Hsinchu County (TW); Chen-Lin Yang, Zhubei (TW); Hsiu-Hui Yang, Qingshui Township, Taichung County (TW); Shao-Yu Chou, Chu Pei (TW)

(73) Assignee: Taiwan Semiconductor Manufacturing Co. Ltd., Hsin-chu (TW)

( * ) Notice: Subject to any disclaimer, the term of this patent is extended or adjusted under 35 U.S.C. 154(b) by 305 days.

(21) Appl. No.: 12/786,791

(22) Filed: May 25, 2010

(65) Prior Publication Data

US 2011/0292754 A1     Dec. 1, 2011

(51) Int. Cl.
*G11C 11/34* (2006.01)
*G11C 7/00* (2006.01)

(52) U.S. Cl. .......... 365/230.06; 365/185.23; 365/189.11

(58) Field of Classification Search ............. 365/230.06, 365/185.23, 154, 189.11
See application file for complete search history.

(56) References Cited

U.S. PATENT DOCUMENTS

| 6,021,079 | A | * | 2/2000 | Worley | 365/225.7 |
| 7,313,050 | B2 | | 12/2007 | Lee | |
| 7,639,545 | B2 | | 12/2009 | Morein | |

\* cited by examiner

*Primary Examiner* — VanThu Nguyen
*Assistant Examiner* — Khamdan Alrobaie
(74) *Attorney, Agent, or Firm* — Duane Morris LLP

(57) ABSTRACT

A word-line driving circuit for driving a word-line in a memory array includes a NAND circuit having a pair of address inputs and an output, an output inverter circuit having an inverter power supply node, an input coupled to the output of the NAND circuit and an output for providing a word line signal, a power gate coupled between a first power supply node and the inverter power supply node, and a control circuit coupled to the power gate. The control circuit controls the power gate to place the word line driver circuit in active or standby mode in response to the output of the NAND circuit.

13 Claims, 4 Drawing Sheets

MEMORY WORD-LINE DRIVER HAVING REDUCED POWER CONSUMPTION

FIELD OF THE INVENTION

The present invention relates generally to semiconductor memory designs, and, more particularly, to a memory word-line driver design.

BACKGROUND OF THE INVENTION

The core of a semiconductor memory comprises at least one two-dimensional memory cell array, where information is stored. Traditionally, word-lines select rows, which activate cells, and bit-lines select columns, which access, i.e., read or write, the cells. When a word-line and a bit line are activated, a particular memory cell connected to them is selected.

To activate a word-line, its voltage is normally set to a high voltage (Vdd), which is equal to a positive supply voltage in a CMOS circuitry. Setting a word-line to a low voltage (Vss), which is a voltage complimentary to the positive supply voltage, deactivates the word-line. While the low voltage is customarily set to ground, or 0 V, the value for the high voltage can be different for various semiconductor manufacturing technologies. For instance, in a deep-submicron technology, a high voltage can be 1.2 V or even lower, while in a submicron technology the high voltage can be 2.5 V. But for a given memory chip and a given technology, the high voltage is normally designed to a fixed value, and this is particularly true for a complimentary-metal-oxide-semiconductor (CMOS) memory circuitry. DVS (dynamic voltage scaling) is often used to reduce power consumption. However, only small VDD scaling ranges can be used for memory circuits when compared with surrounding digital logic circuitry. For this reason, memory circuits are often operated at the higher VDD, or a dual-rail design is applied.

Since there are multiple memory cells connected to a single word-line, and the word-line itself can be very long depending on the memory array size and technology used, so the word-line can be quite a load for its corresponding decoder, then a driver is needed to drive the word-line. The word-line driver couples, on one end, to a word-line decoder output, and on the other end, to a word-line. When a memory chip is in an active mode, i.e., the memory chip is ready for being actively read or written, the word-line driver functions just as a regular driver, following the word-line decoder, and providing a current source to pull up the word-line to a high voltage when the word-line is selected, and pull down the word-line to a low voltage when the word-line is not selected. When the memory chip is in a standby mode, i.e., the memory cannot be actively read or written, and the power consumption is maintained at a minimum just to retain the information stored in the memory cell arrays, then the word-line driver clamps the word-line voltage to low.

Semiconductor Random Access Memory (RAM) circuits store logic states by applying either a high voltage level (such as for logic "1") or a low voltage level (such as for logic "0") to the memory cell transistors that comprise the memory array. In word line voltage control circuits, the high and low (or negative) voltage levels are applied to a selected word line in a selected sector of the memory array by a decoder circuit. Current word line drivers typically used in SRAM (static RAM) devices are NAND-style decoders that are followed by one or more stages of inverters to buffer the signal. This design is generally optimal for active power and performance, but results in high power consumption due to leakage power losses. In certain operation modes, this leakage power can dominate the active power consumption of the memory chip.

Conventional power gating schemes for word-line drivers in SRAM arrays utilizes a segment-based or macro-based approach (hereinafter referred to as "blocks" or "block-based"). Each block includes a plurality of word lines, such as 1024 lines. The word-line drivers are powered on by block control signal and not powered down unless the block is disabled in its entirety. This block-based approach is inefficient in terms of both metal routing and power consumption.

FIG. 1 is a circuit diagram of a prior art word-line driver circuit 10 for use in this type of memory cell. The word-line driver includes a NAND circuit 12, which includes transistors M1, M2 and M3, an output inverter 14, which includes transistors M4 and M5, and a power gating device 16 shown as transistor M6. The NAND circuit 12 and inverter circuit 14 cooperate to provide an AND function, with address signals XDEC and WLPY as inputs to the AND gate. As those familiar with these types of word-line drivers will understand, XDEC and wlpy are bus signals for a block of, for example, 1024 word-lines, which can be expressed as xdec[*] and wlpy[*]. For a single word-line driver circuit, there are only one XDEC and one wlpy signals. Both XDEC and wlpy are address signals. XDEC is the output of a word-line decoder circuit and wlpy is the product of an address signal passed through a clock gating circuit to be form a pulse signal.

Assuming block select signal PD is of the proper bias to turn power gating transistor M6 "on" then the driver circuit 10 operates such that when both signal XDEC, and signal WLPY are high (meaning WLPY bar (WLPYB) is low), the output signal WL is logical high ("1"). Otherwise, the output signal WL is logical low ("0"). As can be seen from FIG. 1, the word-line driver circuit 10 is designed in the high-Vdd (Vddh) domain, while surrounding peripherals may be designed in the low-Vdd (Vddl) domain for dual rail power schemes. This approach requires a level shifter circuit (not shown) to provide control signal PD. This peripheral circuit lowers the power efficiency of the memory array. Moreover, power gating device M6 is often centralized in the array to serve several word line drivers. This layout consumes a lot of metal routing resources.

An improved word-line driver circuit is desired.

SUMMARY OF THE INVENTION

A word-line driving circuit for driving a word-line in a memory array includes a NAND circuit having a pair of address inputs and an output, an output inverter circuit having an inverter power supply node, an input coupled to the output of the NAND circuit and an output for providing a word line signal, a power gate coupled between a first power supply node and the inverter power supply node, and a control circuit coupled to the power gate. The control circuit controls the power gate to place the word line driver circuit in active or standby mode in response to the output of the NAND circuit.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 4:
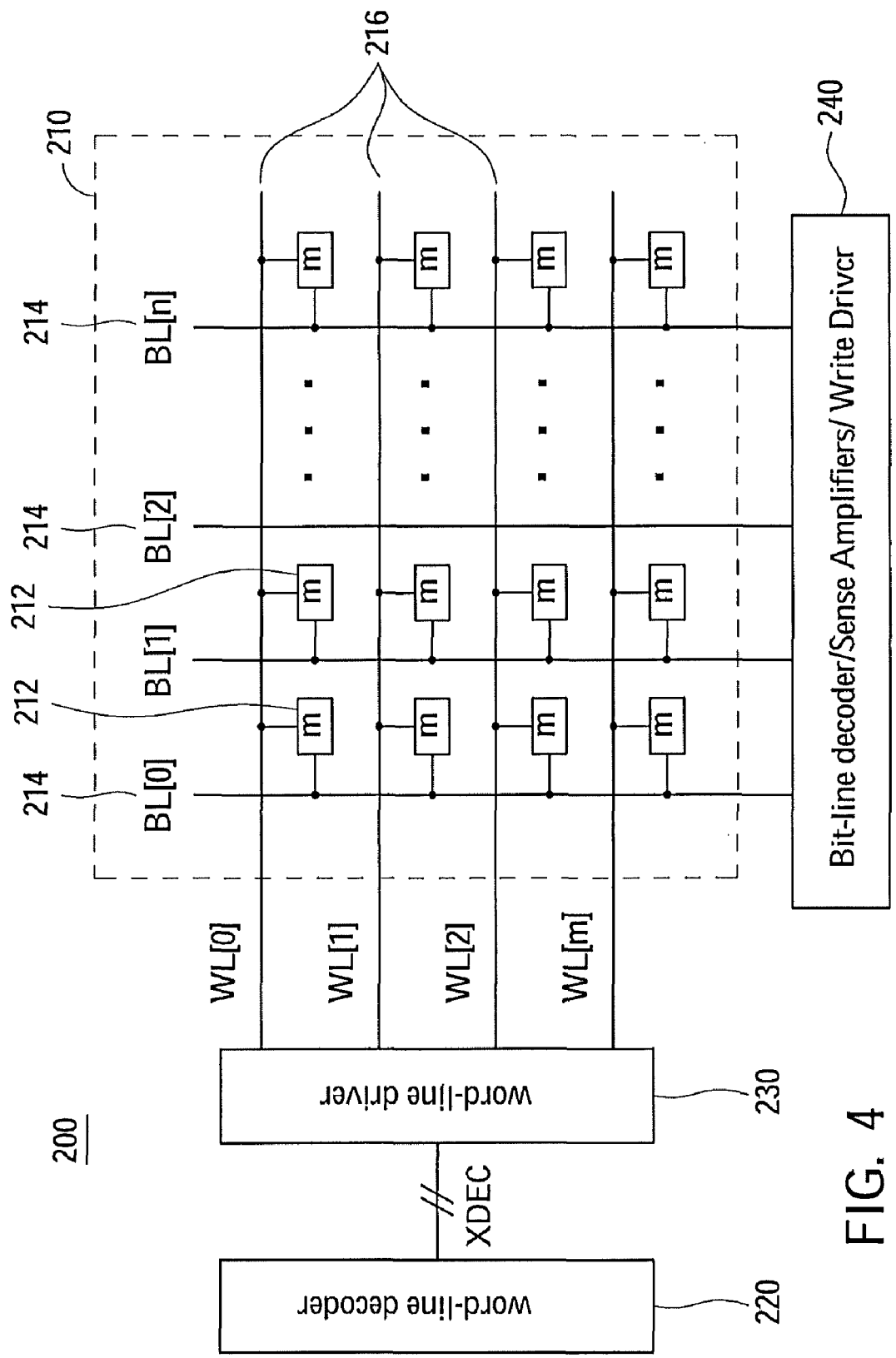
FIG. 4 is a diagram of a memory device in which the word-line driver circuit illustrated in FIGS. 2-3 can be employed.

FIG. 4 illustrates a memory device 200 with a core array 210 with m+1 number of rows and n+1 number of columns of memory cells. While note shown it should be understood that at single memory device 200 can include a plurality of blocks of memory each configured as shown in FIG. 4. The memory cells are labeled as "M" in the array 210 and assigned reference number 212. Rows of cells M are selected by m+1 number of corresponding word-lines [0:m] 216, while the columns are selected by n+1 number of bit-lines [0:n] 214. The word-lines WL[0:m] 216 are driven by word-line decoder 220 through their corresponding drivers in word line driver circuit 230. When a word-line 216 is set to a high voltage, all the cells 212 connected to the word-line will be selected. But which memory cell is accessed, i.e. read or written, also depends on which bit-line 214 is selected. For instance, if word-line[1] and bit-line[n] are both selected, the memory cell M[1,n] is accessible or selected. The bit-lines [0:n] 214 connect to bit-line-decoder/sense-amplifiers/write-driver 240, for read or write of selected memory cells.

In exemplary embodiments, the memory cells 212 are configured as static random access memory (SRAM), though the teachings disclosed herein are applicable to other volatile memories such as dynamic random access memory (DRAM) cells.

Two supply voltages are normally used in memory arrays: a positive supply voltage (e.g., Vdd) and its complementary supply voltage (e.g., Vss or GND). A CMOS circuitry always operates from rail to rail with Vdd as an upper rail and Vss as a lower rail. The improved word-line driver circuit disclosed herein has particular benefits when the upper rail utilizes a dual-rail power domain design, meaning there is a lower power domain upper rail (Vddl) and a higher power domain upper rail (Vddh) in addition to the Vss rail. Powering various circuits in the memory device from the Vddl rail helps conserver power. However, for preferred operation, the final stage of the word line driver should be powered in the Vddh domain.

An improved word-line driver and driving scheme are described herein. The word-line driver scheme utilizes automatic row-based power gating control without the need for extra control signals. The word-line driver improves the disadvantages of the conventional power gating scheme for word-line drivers in memory arrays such as SRAM arrays. The improved word-line driver provides a more fine-grained row-based power control approach for word-line driving. The word-line driver also provided benefits in dual-rail SRAM designs. For example, in dual-rail SRAM, the word-line driver removes the need for level-shifters and enlarges the low-VDD domain to further reduce power consumption.

Figure 2:
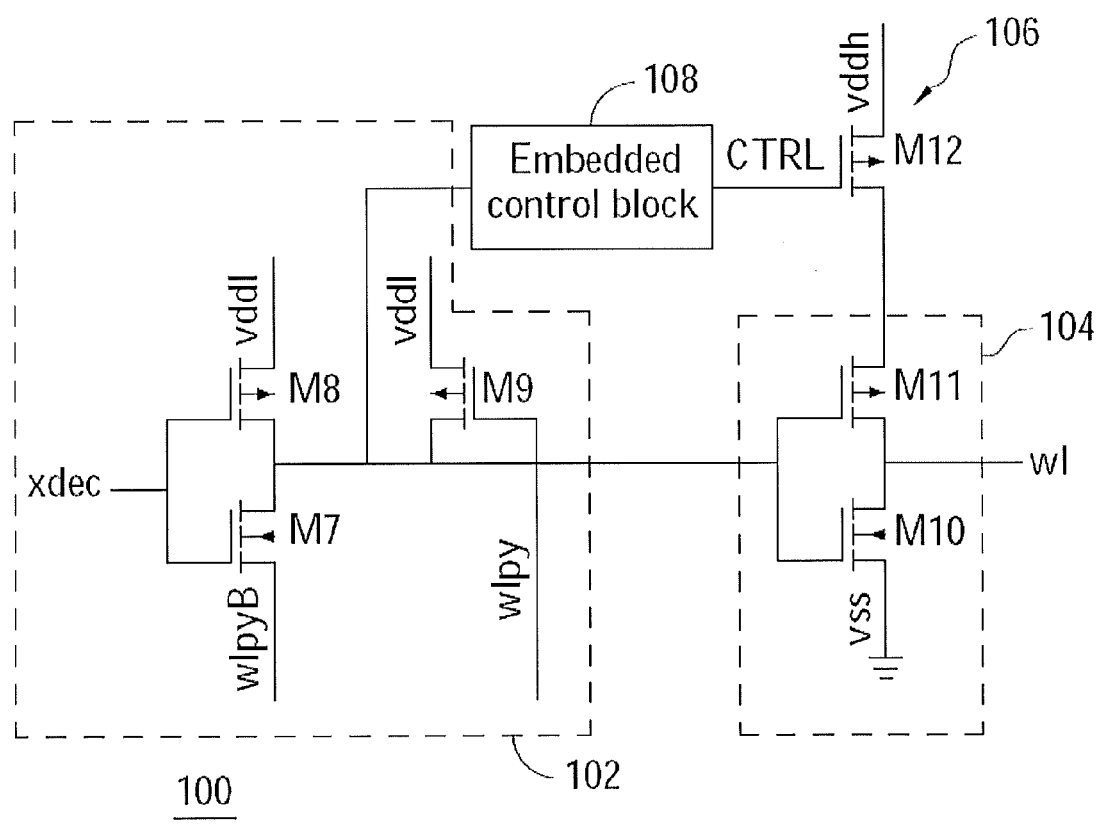
FIG. 2 is a circuit diagram of a word-line driver circuit according to an embodiment of the present invention.

FIG. 2 illustrates a word line driver circuit 100 in accordance with an embodiment of the present invention. Similar to word line driver circuit 10 described above, the word line driver circuit 100 includes a NAND circuit 102 formed by transistors M7 to M9 and an output inverter 104 formed by transistors M10 and M11. Together, NAND gate 102 and output inverter 104 operate as an AND circuit having inputs XDEC and WLPY and output WL. Unlike driver circuit 10, NAND circuit 102 is operated in the low-VDD domain Vddl.

Figure 1:
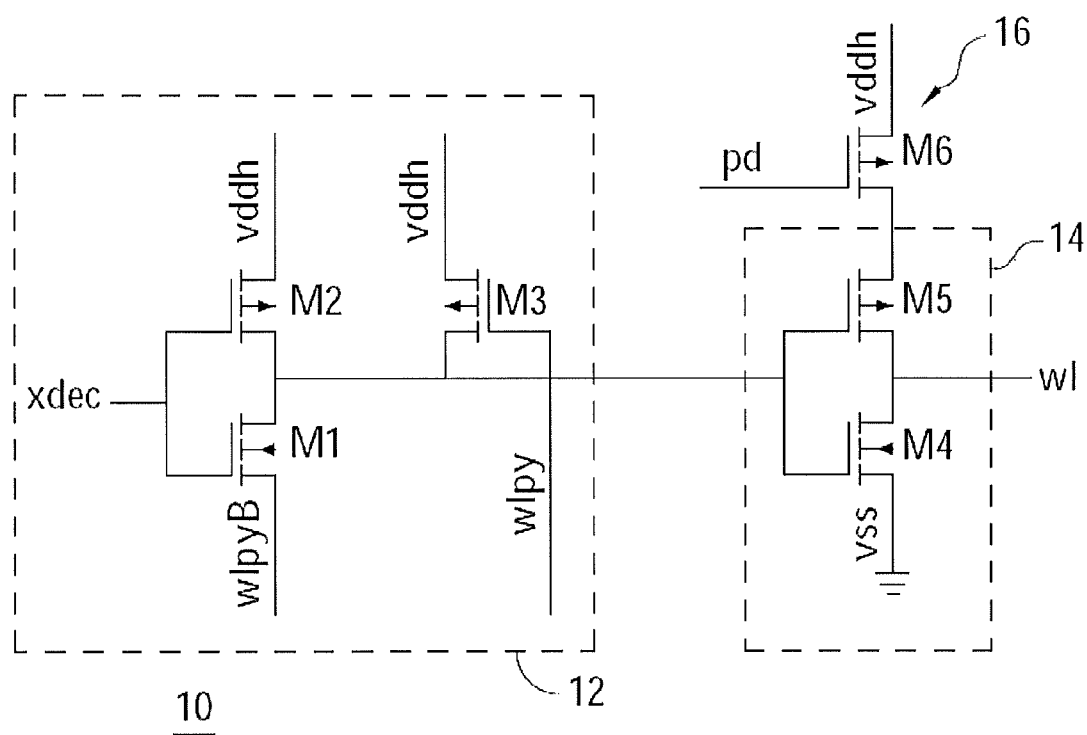
FIG. 1 is a circuit diagram of a prior art word-line driver circuit.

The word line driver 100 also includes a power gating/pass device 106 operated in the high-VDD domain (Vddh). The power gating device 106 includes PMOS transistor M12, which is responsive to a control signal CTRL at its gate terminal. Control signal CTRL is not a global block control signal like PD in FIG. 1. Rather, the control signal CTRL is locally generated by Embedded Control Block 108 responsive to the output of the NAND circuit 102, which is responsive to address signals XDEC and WLPY. More specifically, Embedded Control Block 108 provides signal CTRL to trigger PMOS 12 only when both XDEC and WLPY are logical high. Assuming power gating device 106 is a PMOS transistor as shown, signal CTRL is driven low when both XDEC and WLPY are logical high. Otherwise, if either or both of the address signals are low, then CTRL is high and PMOS M12 is off, which forces the word-line driver 100 into standby mode. With power gating device 106 controlled locally and only being on when both XDEC and WLPY are logical high, there is no need for a global block control signal for activating the word-line driver 100. Rather, the word line signal WL is high only when a specific word-line is selected for operation. All unselected word-lines in a memory bloc are in the sleep or standby mode. This row-based control scheme provides power savings by ensuring that non-accessed word line drivers 100 automatically enter the power down mode.

Embedded Control block 108 could be configured to perform a second logical NAND operation with signals XDEC and WLPY as address inputs though such a configuration may not be preferred when leakage current concerns are considered.

Figure 3:
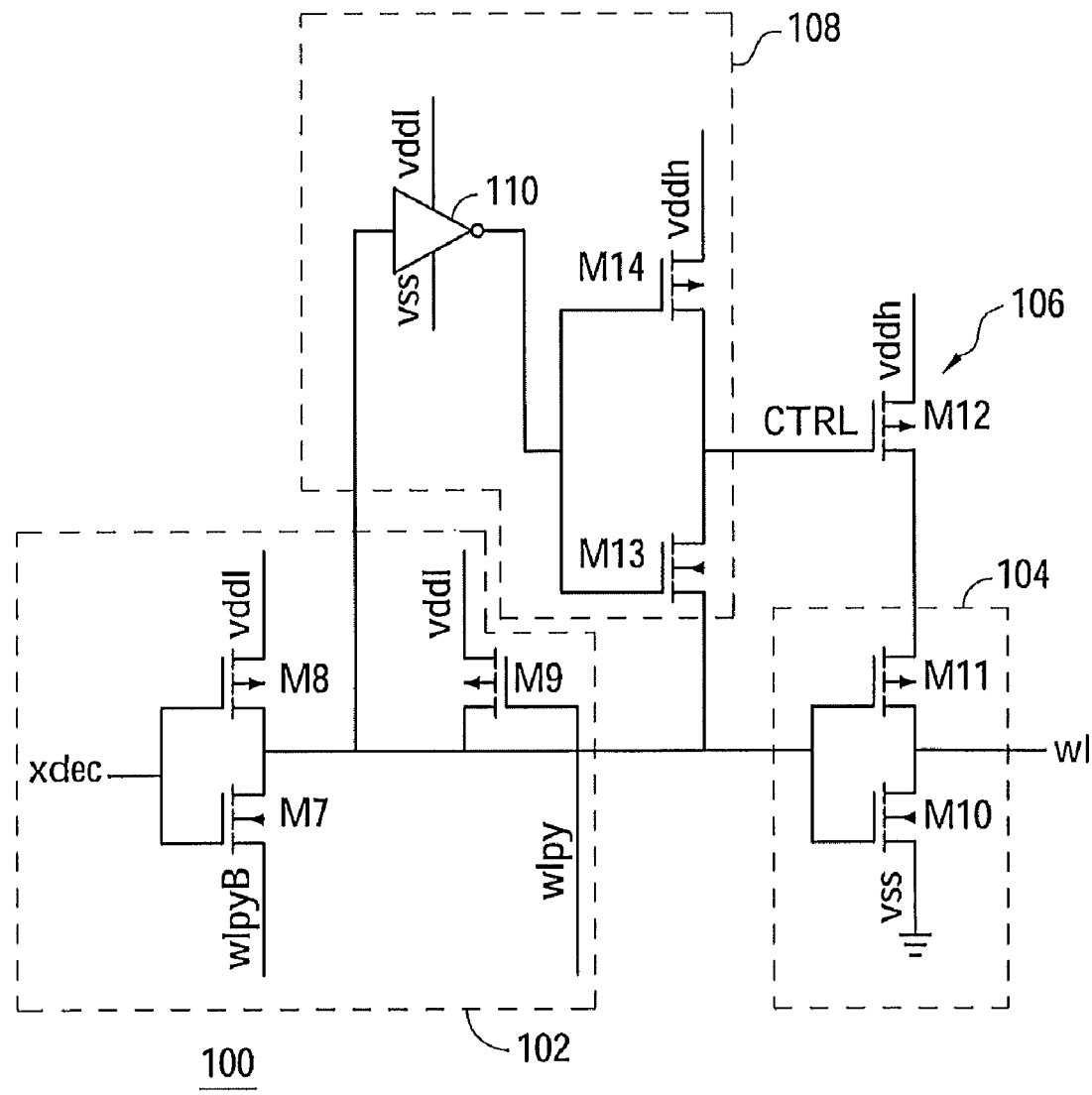
FIG. 3 is a circuit diagram of an embodiment of the word-line driver of FIG. 2.

FIG. 3 illustrates a specific embodiment of the Embedded Control Block 108 integrated within the word line driver 100. The Embedded Control Block 108 operates to (1) pass the control signal from NAND circuit 102 to the gate of PMOS M12 for switching the word-line driver 100 between active and standby mode and (2) level shifting that control signal from the Vddl domain to the Vddh domain. As shown in FIG. 3, the Embedded Control Block 108 includes an inverter 110 having an input coupled to the output of the NAND circuit 102, which is also the input of the output inverter 104. The output of the inverter 110 is coupled to the input of an inverter circuit including cascaded transistor pair M13 and M14 coupled between Vddh and the output of the NAND circuit 102, which again is also the input of the output inverter 104. This circuit (M13/M14) also serves as a built-in level shifter. The source of NMOS M13 could be connected to ground, but in one preferred embodiment as shown in FIG. 3 the source of NMOS M13 is coupled to the output of the NAND circuit 102. This configuration provides for leakage current savings. When WL is "0", which means the NAND output is "1", then the leakage of the second inverter of the control block 108 can be reduced. Of particular note, the low-VDD domain (Vddl) has been enlarged in the word line driver 100 allowing for additional power savings. The NAND circuit 102 and the inverter 110 of the Embedded Control Block 108 are all powered by the lower supply voltage Vddl while only the circuit formed by M13/M14 and the output inverter 104/ power gating device 106 are powered in the higher supply voltage Vddh domain. The circuit gains more benefits from dynamic voltage scaling (DVS) than prior art memory devices using DVS. Moreover, since the voltage level of the word-line pulse (WL) is kept at high Vddh, the write Vccmin is not sacrificed and read speed is improved when compared to suppressed word-line approaches with little area penalty (e.g., 10% or less).

Simulations were performed to analyze the standby power, active power and total power performance of the new word-line driver. Specifically, simulation were performed to compare the word line driver when fabricated using the assignee's 45 nm general purpose (high speed) process and the assignee's 45 nm low power process versus the prior art word-line driver of FIG. 1. The simulation results showed that that new word-line driver, which automatically enters the power down mode on a word-line-by-word-line basis, consumed only between about 0.1 to 0.4 times the standby power of the prior art block-based power gating word line driver design. The simulations showed that individual word line-drivers when active consumed slightly more power on a word-line driver-by-word-line driver basis than their prior art counter-parts during active mode. However, for the 45 nm general purpose process the overall total power consumption was only between about 0.2 to 0.4 times that of the prior art word-line driver since only accessed word-line drivers were active at a given time. For example, assuming a selected block of 1024 word-line drivers, in the new word-line driving scheme only one word-line driver out of the 1024 would be active and 1023 would be in the standby mode, whereas with the block controlled approach of the prior art, either all 1024. word-line drivers were active or all were in stand-by mode. For the 45 nm low power process, the total power consumption showed improvements similar to the 45 nm general purpose process at simulation temperatures around 100° C. and little change in total power consumption at lower temperature (e.g., 25° C.). However, the total power consumption simulated for the prior art word-line driver circuit did not include power that would be consumed by the level shifter circuit stage. Therefore, actual results are expected to be better than the simulation results.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A word-line driving circuit for driving a word-line in a memory array comprising;
    a NAND circuit having a pair of address inputs and an output;
    an output inverter circuit having an inverter power supply node, an input coupled to the output of the NAND circuit and an output for providing a word line signal;
    a power gate coupled between a first power supply node and the inverter power supply node; and
    a control circuit coupled to the power gate, the control circuit controlling the power gate to place the word line driver circuit in active or standby mode in response to the output of the NAND circuit, the control circuit including:
        a first inverter circuit having an input coupled to the output of the NAND circuit and an output, and
        a second inverter circuit having an input coupled to the output of the first inverter circuit and an output coupled to the power gate, the second inverter comprising a PMOS/NMOS transistor pair coupled between the first power supply node and the output of the NAND circuit.

2. The word-line driver circuit of claim 1, further comprising a second power supply node, wherein the first power supply node is a high voltage domain power supply (Vddh) node and the second power supply node is a low voltage domain power supply (Vddl) node, wherein the NAND circuit is powered by the Vddl node.

3. The word-line driver circuit of claim 2, wherein the control circuit is coupled between the output of the NAND circuit and the power gate, wherein the control circuit is operable to level shift the output of the NAND circuit from the Vddl domain to the Vddh domain and pass the level shifted output to the power gate for control of the power gate.

4. The word-line driver circuit of claim 3, wherein the first inverter circuit is powered by the Vddl node and the second inverter circuit is powered by the Vddh node.

5. The word-line driver circuit of claim 1, wherein the power gate is a PMOS transistor switch having a gate terminal coupled to an output of the control circuit, a drain terminal coupled to the first power supply node and a source terminal coupled to the inverter power supply node.

6. A memory device comprising:
    a memory array including a first block of memory cells, the first block of memory cells comprising a plurality of memory cells arranged in a plurality of rows and columns accessible via a plurality of word-lines and bit-lines;
    a word-line driver circuit coupled to the memory array, the word-line driver including a plurality of word-line drivers, each word-line driver having a respective output coupled to a respective word-line from the first block of memory cells, each word-line driver circuit comprising:
        a NAND circuit having a pair of address inputs and an output;
        an output inverter circuit having an inverter power supply node, an input coupled to the output of the NAND circuit and an output for providing a word line signal to a respective word-line from the first block of memory cells;
        a power gate coupled between a first power supply node and the inverter power supply node; and
        a control circuit coupled to the power gate, the control circuit controlling the power gate to place the word line driver circuit in active or standby mode when the word-line driver circuit's respective word-line is selected and in standby mode when the respective word-line is not selected, the control circuit including:
            a first inverter circuit having an input coupled to the output of the NAND circuit and an output, and
            a second inverter circuit having an input coupled to the output of the first inverter circuit and an output coupled to the power gate, the second inverter comprising a PMOS/NMOS transistor pair coupled between the first power supply node and the output of the NAND circuit.

7. The memory device of claim 6, wherein the memory cells are static random access (SRAM) cells.

8. The memory device of claim 6, wherein each word-line driver circuit has a second power supply node, wherein the first power supply node is a high voltage domain power supply (Vddh) node and the second power supply node is a low voltage domain power supply (Vddl) node, wherein the NAND circuit is powered by the Vddl node.

9. The memory device of claim 8, wherein the control circuit is coupled between the output of the NAND circuit and the power gate, wherein the control circuit is operable to level shift the output of the NAND circuit from the Vddl domain to the Vddh domain and pass the level shifted output to the power gate for control of the power gate.

10. The memory device of claim 9, wherein the first inverter circuit is powered by the Vddl node and the second inverter circuit is powered by the Vddh node.

11. The memory device of claim 6, wherein the power gate is a PMOS transistor switch having a gate terminal coupled to an output of the control circuit, a drain terminal coupled to the first power supply node and a source terminal coupled to the inverter power supply node.

12. A word-line driver circuit for driving a word-line in a memory array, the word-line driver circuit comprising:
- a NAND circuit having a pair of address inputs and an output, the NAND circuit operating from a low voltage power supply domain (Vddl) rail;
- an output inverter circuit having an input coupled to the output of the NAND circuit and an output for providing a word line signal for driving the word-line, the output inverter circuit operating from a high voltage power supply domain (Vddh) rail;
- a power gate coupled between the Vddh rail and the output inverter circuit; and
- a control circuit coupled between the output of the NAND circuit and the power gate, the control circuit being operable to level shift the output of the NAND circuit from the Vddl domain to the Vddh domain and pass the level shifted output to the power gate for control of the power gate to switch the word-line driver circuit into active mode or standby mode in response to the output of the NAND circuit, the control circuit including:
  - a first inverter circuit having an input coupled to the output of the NAND circuit and an output, the first inverter circuit operating from the Vddl rail; and
  - a second inverter circuit having an input coupled to the output of the first inverter and an output coupled to the power gate, the second inverter circuit operating from the Vddh rail, the second inverter circuit comprising a PMOS/NMOS transistor pair coupled between the Vddh rail and the output of the NAND circuit.

13. The word-line driver circuit of claim 12, wherein the power gate is a PMOS transistor having a gate terminal coupled to the output of the second inverter, a drain terminal coupled to the Vddh rail and a source terminal coupled to output inverter circuit.

* * * * *

UNITED STATES PATENT AND TRADEMARK OFFICE
CERTIFICATE OF CORRECTION

| | |
|---|---|
| PATENT NO. | : 8,391,097 B2 |
| APPLICATION NO. | : 12/786791 |
| DATED | : March 5, 2013 |
| INVENTOR(S) | : Wei Min Chan et al. |

It is certified that error appears in the above-identified patent and that said Letters Patent is hereby corrected as shown below:

In the Claims:

Claim 1, Column 5, Line 43, delete ";" after "comprising" and insert -- : --.

Claim 13, Column 8, Line 19, insert -- the -- after "coupled to".

Signed and Sealed this
Third Day of December, 2013

Margaret A. Focarino
*Commissioner for Patents of the United States Patent and Trademark Office*